(12) United States Patent
Horio et al.

(10) Patent No.: US 8,026,566 B2
(45) Date of Patent: Sep. 27, 2011

(54) SEMICONDUCTOR DEVICE AND METHOD FOR MANUFACTURING SEMICONDUCTOR DEVICE

(75) Inventors: Masafumi Horio, Matsumoto (JP); Yoshinari Ikeda, Matsumoto (JP); Eiji Mochizuki, Matsumoto (JP)

(73) Assignee: Fuji Electric Systems Co., Ltd., Tokyo (JP)

( * ) Notice: Subject to any disclaimer, the term of this patent is extended or adjusted under 35 U.S.C. 154(b) by 362 days.

(21) Appl. No.: 12/149,115

(22) Filed: Apr. 28, 2008

(65) Prior Publication Data

US 2008/0284033 A1 Nov. 20, 2008

(30) Foreign Application Priority Data

May 18, 2007 (JP) ................. 2007-132573

(51) Int. Cl.
*H01L 23/485* (2006.01)
*H01L 21/60* (2006.01)

(52) U.S. Cl. ... 257/462; 257/734; 257/779; 257/E23.01; 257/E23.062; 257/E21.51; 438/121; 438/123

(58) Field of Classification Search ................. 257/762, 257/779, E21.51, E23.062
See application file for complete search history.

(56) References Cited

U.S. PATENT DOCUMENTS

| 6,353,258 B1 * | 3/2002 | Inoue et al. ................ 257/723 |
| 2005/0127503 A1 * | 6/2005 | Gobl et al. ................ 257/734 |
| 2008/0264675 A1 * | 10/2008 | Lee et al. .................. 174/250 |

FOREIGN PATENT DOCUMENTS

| CN | 1649098 A | 8/2005 |
| EP | 0789397 A2 | 8/1997 |
| JP | S61-107751 | 5/1986 |
| JP | H02-121341 | 5/1990 |
| JP | H04-252040 | 9/1992 |
| JP | H05-036740 | 2/1993 |
| JP | H06-283560 | 7/1994 |
| JP | 2001-508240 | 6/2001 |
| JP | 2003-174114 | 6/2003 |
| JP | 2003-289130 | 10/2003 |
| JP | 2004-119944 | 4/2004 |
| JP | 2005-223156 | 8/2005 |
| WO | WO 98/32213 | 7/1998 |

OTHER PUBLICATIONS

Small-Pack and Small-PIM IGBT Modules; Kousuke Komatsu et al; Fuji Electric Journal vol. 78, No. 4, p. 260-263 (2005).
U-series of IGBT Modules; Shuji Miyashita; Fuji Electric Journal vol. 77, No. 5, p. 313-316 (2004).

* cited by examiner

*Primary Examiner* — N Drew Richards
*Assistant Examiner* — Mamadou Diallo
(74) *Attorney, Agent, or Firm* — Manabu Kanesaka

(57) ABSTRACT

A semiconductor device includes a first metal foil, an insulating sheet mounted on an upper surface of the first metal foil main, at least one second metal foil mounted on the insulating sheet, at least one solder layer mounted on the at least one second metal foil, and at least one semiconductor element mounted on the at least one second metal foil through the at least one solder layer. The at least one semiconductor has a thickness of 50 μm or greater and less than 100 μm.

4 Claims, 10 Drawing Sheets

Fig. 1
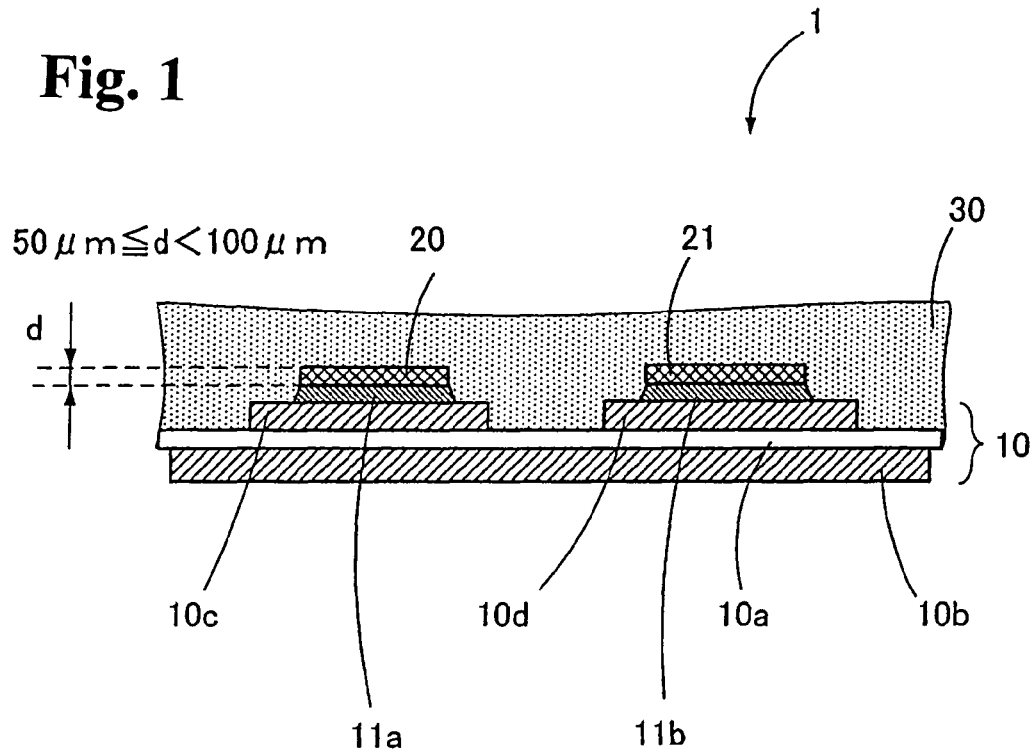
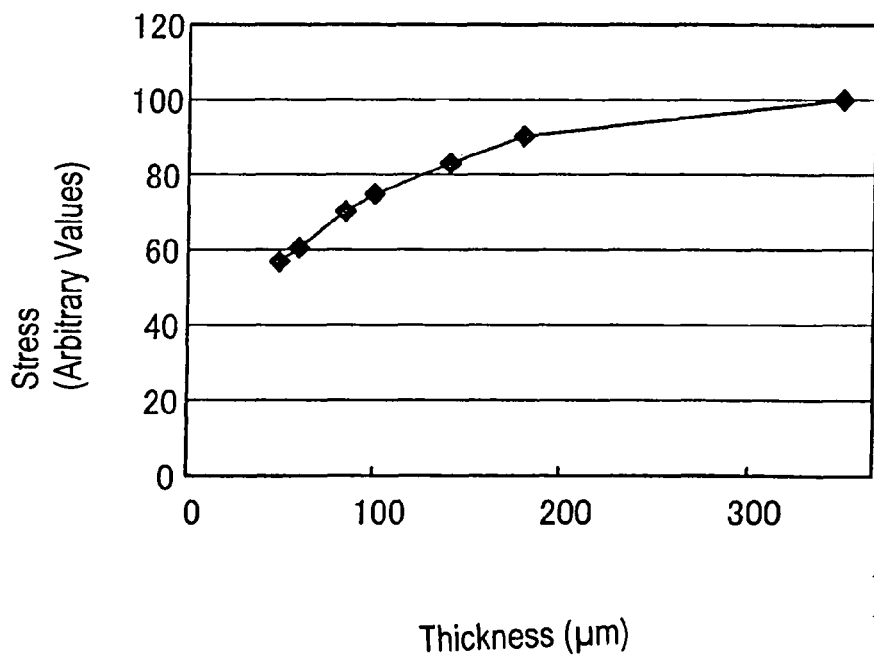
Fig. 2

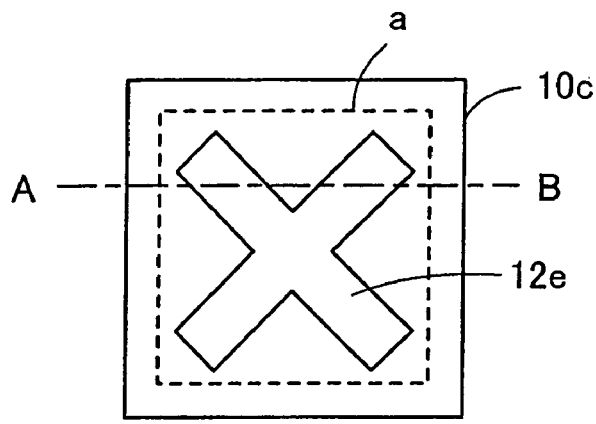
Fig. 10(A)
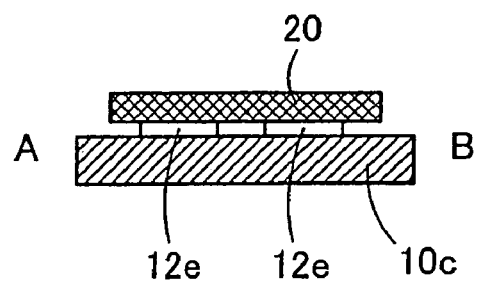
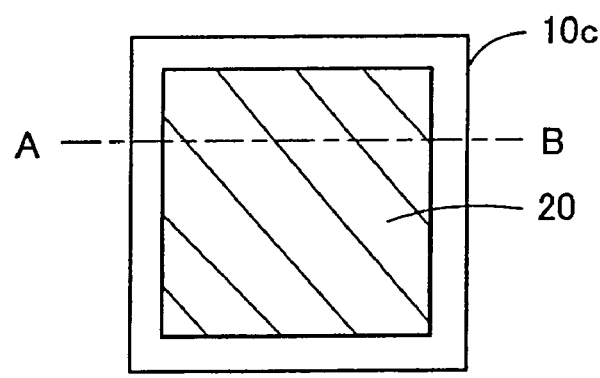
Fig. 10(B)
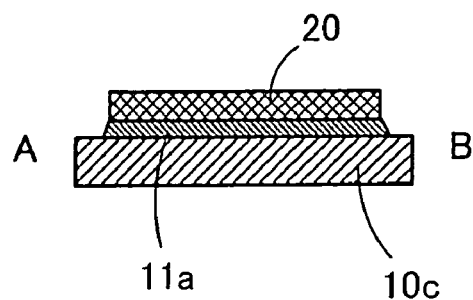

SEMICONDUCTOR DEVICE AND METHOD FOR MANUFACTURING SEMICONDUCTOR DEVICE

BACKGROUND OF THE INVENTION AND RELATED ART STATEMENT

This invention relates to a semiconductor device equipped with a power semiconductor element.

In inverter devices, uninterruptible power supply devices, machining equipments, industrial robots, and other equipments, semiconductor modules which are independent of the main unit of the equipment (general-use modules) are employed.

As semiconductor devices, for example, a metal base plate of prescribed thickness is used as a foundation, and a package equipped with power semiconductor devices is provided on the metal base plate (see Patent Document 1: Japanese Patent Application Publication No. 2003-289130). FIG. 11 is a schematic diagram of a semiconductor device employing a metal base plate as a foundation.

This semiconductor device 100 employs a metal base plate 101 with several millimeters in thickness as a foundation; onto the metal base plate 101 is mounted a metal foil 103 through a solder layer 102. Onto the metal foil 103 is mounted an insulating sheet 104, and onto the insulating sheet 104 are mounted metal foils 105, 106. Further, on the metal foils 105, 106 are mounted semiconductor devices 109, 110 through solder layers 107, 108. Here, the semiconductor devices 109, 110 are, for example, IGBTs (Insulated Gate Bipolar Transistors), FWDs (Free Wheeling Diodes), or other devices. Furthermore, onto the semiconductor devices 109, 110 are mounted heat spreaders 113, 114 through solder layers 111, 112. A resin case 115, molded so as to surround the semiconductor devices 109, 110 and similar, is fixed onto the upper edge of the metal base plate 101. In a hole 117 of the resin case 115, is provided a reinforcement metal ring 118.

Although not shown, metal wires, lead frames, and similar are arranged on the periphery of the semiconductor devices 109 and 110; for example, terminals of the semiconductor devices 109, 110 are electrically bonded to a circuit pattern formed on the insulating sheet 104, or, electrical connections are formed between terminals of the semiconductor devices 109, 110.

Further, the interior of the resin case 115 is filled with a gel 116 comprising a silicone material in order to prevent contact between metal wires and similar, and to protect the semiconductor devices 109, 110, and similar from moisture, humidity, and dust.

Recently, a small-size semiconductor device has been disclosed which does not employ a metal base plate 101 as a foundation (see, for example, Japanese Non-patent Document 1: Komatsu, Soutome and Ikawa, "Small Capacity IGBT Module", Fuji Jihou, Vol. 78, No. 4, 2005, p. 260 to 263).

FIG. 12 is a schematic diagram of a semiconductor device which does not employ a metal base plate.

In this semiconductor device 200, an insulating sheet 104, metal foil 103 formed on the lower face of the insulating sheet 104, and metal foils 105, 106 formed on the upper face of the insulating sheet 104 serve as the foundation. Semiconductor devices 109, 110 are mounted onto the metal foils 105, 106 through solder layers 107, 108.

In the semiconductor device 200, a resin case 115, molded so as to surround the semiconductor devices 109, 110 and similar, is fixed onto the upper edge of the insulating sheet 104. The interior of the resin case 115 is similarly filled with a gel 116 comprising a silicone material.

By means of such a semiconductor device 200, because a thick metal base plate is not used as a foundation, the semiconductor device can be made lighter in weight, smaller in size, and lower in cost.

Further, as the semiconductor elements 109, 110 mounted within the semiconductor device 100, 200, recently, thin semiconductor elements with reduced turn-off losses have been used (see, for example, Japanese Non-patent Document 2: Miyashita, "U series IGBT modules"), Fuji Jiho, Vol. 77, No. 5, 2004, p. 313 to 316).

For example, conventionally, PT (Punch Through) type semiconductor elements, having a thickness of approximately 350 µm and fabricated using epitaxial silicon substrates, have been mainly used. Recently, however, the use of NPT (Non-Punch Through) semiconductor elements having a thickness of approximately 100 µm and fabricated using FZ (Floating Zone) substrates has become popular.

However, if the semiconductor devices 100, 200 described above are repeatedly operated, because the thickness of the mounted semiconductor elements 109, 110 is 100 µm or greater, heat generation and dissipation by the semiconductor elements 109, 110 causes substantially expansion of the semiconductor elements 109, 110. As a result, excessive amount of stress repeatedly occurs between the semiconductor elements 109, 110 and the solder layers 107, 108 below the semiconductor elements 109, 110.

If such semiconductor devices 100, 200 are operated over extended periods of time, the adhesive forces between the semiconductor elements 109, 110 and the solder layers 107, 108 cannot withstand the stress, and peeling occurs at the interface between the semiconductor elements 109, 110 and the solder layers 107, 108 to cause wire breakage. Consequently, there is a problem that reliability of the semiconductor device is undermined.

This invention has been made in light of the above circumstances, and has as an object to provide a semiconductor device with excellent reliability even when used over extended period of time, as well as a method for manufacturing such a semiconductor device.

Further objects and advantages of the invention will be apparent from the following description of the invention.

SUMMARY OF THE INVENTION

In order to attain the above object, this invention provides a semiconductor device, wherein the semiconductor device comprises an insulating sheet; a first metal foil which is mounted to a first main face of the insulating sheet; at least one second metal foil which is mounted to a second main face of the insulating sheet; and at least one semiconductor element which is mounted onto the second metal foil through a solder layer, and the thickness of which is 50 µm or greater and less than 100 µm.

In such a semiconductor device, the first metal foil is mounted to the first main face of the insulating sheet, at least one second metal foil is mounted to the second main face of the insulating sheet, and at least one semiconductor element of thickness 50 µm or greater and less than 100 µm is mounted onto the second metal foil through a solder layer.

Further, this invention provides a method for manufacturing a semiconductor device, wherein the method has a process of preparing a board comprising an insulating sheet, a first metal foil mounted to a first main face of the insulating sheet, and at least one second metal foil mounted to a second main face of the insulating sheet; a process of selectively arranging a wetting suppression layer, which suppresses wetting by solder in the molten state, on the outer peripheral portion of the upper face of the second metal foil; a process of applying solder material to the portion of the second metal foil where the metal face is exposed; a process of placing a semiconductor element of thickness 50 µm or greater and less than 100 µm, on the solder material; and a process of performing heating of the solder material to bond the semiconductor element to the second metal foil through a solder layer.

In such a method for manufacturing a semiconductor device, firstly, a board is prepared, said board comprising an insulating sheet, a first metal foil mounted to a first main face of the insulating sheet, and at least one second metal foil mounted to a second main face of the insulating sheet. Secondly, a wetting suppression layer, which suppresses wetting by solder in the molten state, is selectively arranged on the outer peripheral portion of the upper face of the second metal foil. Thirdly, solder material is applied to the portion of the second metal foil in which the metal face is exposed. Fourthly, a semiconductor element of thickness 50 µm or greater and less than 100 µm is placed on the solder material. Fifthly, by heating the solder material, the semiconductor element and the second metal foil are mounted, through the solder layer.

Further, this invention provides a method for manufacturing a semiconductor device, wherein the method has a process of preparing a board comprising an insulating sheet, a first metal foil mounted to a first main face of the insulating sheet, and at least one second metal foil mounted to a second main face of the insulating sheet; a process of selectively arranging solder material in an element mounting region demarcated on the second metal foil so as to be symmetrical with respect to the center portion of the element mounting region; a process of placing a semiconductor element of thickness 50 µm or greater and less than 100 µm on the solder material; and a process of performing heating of the solder material to bond the semiconductor element to the second metal foil through a solder layer.

In such a method for manufacturing a semiconductor device, a board is at first prepared, said board comprising an insulating sheet, a first metal foil mounted to a first main face of the insulating sheet, and at least one second metal foil mounted to a second main face of the insulating sheet. Secondly, solder material is selectively arranged in an element mounting region demarcated on the second metal foil so as to be symmetrical with respect to the center portion of the element mounting region. Thirdly, a semiconductor element of thickness 50 µm or greater and less than 100 µm is placed on the solder material. Fourthly, by heating the solder material, the semiconductor element and the second metal foil are mounted through a solder layer.

In a semiconductor device of this invention, a first metal foil is mounted to a first main face of an insulating sheet, at least one second metal foil is mounted to a second main face of the insulating sheet, and at least one semiconductor element of thickness 50 µm or greater and less than 100 µm is mounted to the second metal foil through a solder layer.

Further, in a method for manufacturing a semiconductor device of this invention, a board is at first prepared, said board comprising an insulating sheet, a first metal foil mounted to a first main face of the insulating sheet, and at least one second metal foil mounted to a second main face of the insulating sheet. Secondly, a wetting suppression layer which suppresses wetting by solder in the molten state is selectively arranged on the outer peripheral portion of the upper face of the second metal foil. Thirdly, solder material is applied to the portion of the second metal foil in which the metal face is exposed. Fourthly, a semiconductor element of thickness 50 µm or greater and less than 100 µm is placed on the solder material. Fifthly, by heating the solder material, the semiconductor element is bonded with the second metal foil through a solder layer.

Further, in a method for manufacturing a semiconductor device of this invention, a board is at first prepared, said board comprising an insulating sheet, a first metal foil mounted to a first main face of the insulating sheet, and at least one second metal foil mounted to a second main face of the insulating sheet. Secondly, solder material is arranged selectively in an element mounting region demarcated on the second metal foil so as to be symmetrical with respect to the center portion of the element mounting region. Thirdly, a semiconductor element of thickness 50 µm or greater and less than 100 µm is placed on the solder material. Fourthly, by heating the solder material, the semiconductor element and the second metal foil are bonded through a solder layer.

By this means, a semiconductor device with excellent reliability even when used over extended period of time and a method for manufacturing such a semiconductor device are realized.

BRIEF DESCRIPTION OF THE DRAWINGS

FIG. 1 is a schematic diagram of a cross-sectional view of principal portions of a semiconductor device;

FIG. 2 explains the relation between thickness and stress of a semiconductor device;

FIGS. 10(A) and 10(B) are diagrams explaining solder bonding of a semiconductor element and metal foil;

DETAILED DESCRIPTION OF PREFERRED EMBODIMENTS

Figure 3A:
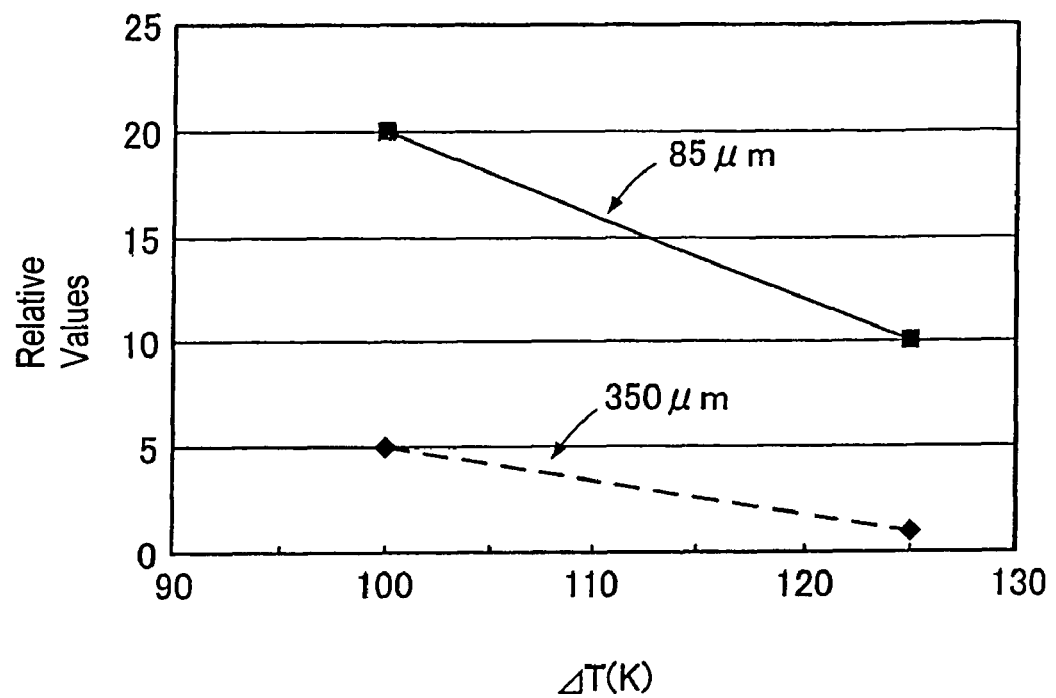
FIGS. 3(A) and 3(B) explain the relation between thickness and power cycle tolerance of a semiconductor device.

Below, embodiments of the invention are explained in detail, referring to the drawings.

To begin with, a first embodiment is explained.

First Embodiment

FIG. 1 is a schematic diagram of a cross-sectional view of principal portions of a semiconductor device.

The semiconductor device 1 shown comprises a plurality of semiconductor elements 20, 21 mounted on a board 10. The semiconductor device 1 is packaged in a resin case (not shown), and functions as a general-purpose IGBT module.

The board 10 comprises an insulating sheet 10a, a metal foil 10b formed by the DCB (Direct Copper Bonding) method on the lower face of the insulating sheet 10a, and a plurality of metal foils 10c, 10d formed by the same DCB method on the upper face of the insulating sheet 10a.

Further, the main-electrode sides (for example, collector electrodes) of semiconductor elements 20, 21 are mounted onto metal foils 10c, 10d respectively, with tin-silver (Sn—Ag) lead-free solder layers 11a, 11b intervening.

Here, the insulating sheet 10a comprises for example a sintered alumina ($Al_2O_3$) ceramic, and the metal foils 10b, 10c, 10d comprise metal, the main component of which is copper (Cu). The semiconductor elements 20, 21 are for example IGBT elements, FWD elements, power MOSFETs (Metal Oxide Semiconductor Field Effect Transistors), or other power semiconductor elements. And, the thickness in the vertical direction of the semiconductor elements 20, 21, between the upper and lower faces of the semiconductor elements 20, 21, is 50 μm or greater and less than 100 μm. The thickness of the insulating sheet 10a is 0.3 to 0.7 mm, and the thickness of the metal foils 10b, 10c, 10d is for example 0.2 to 0.6 mm. The thickness of the solder layers 11a, 11b is 80 to 130 μm.

Further, although not shown in FIG. 1, in addition to the metal foils 10c and 10d, a plurality of metal foils, electrode terminals, and similar are arranged on the insulating sheet 10a. And, a plurality of semiconductor elements (for example, IGBT elements, FWD elements, power MOSFETs, and similar) in addition to the semiconductor elements 20, 21 is mounted on the insulating sheet 10. On the periphery of the semiconductor elements 20, 21 are arranged metal wires, lead frames, and similar; for example, the main electrodes (emitter electrodes) or the control electrodes (gate electrodes) of the semiconductor elements 20, 21, and the different metal foils are bonded, or else electrodes of the semiconductor elements 20, 21 are bonded to each other, using metal wire.

Further, the semiconductor device 1 comprises a resin case (not shown) of for example PPS (polyphenylene sulfide) so as to surround the semiconductor elements 20, 21. In order to protect the semiconductor elements 20, 21 and similar, a gel, the main component of which is for example silicone, or a sealant 30 comprising an epoxy resin, is filled into the inner faces of the resin case.

In particular, while not shown in FIG. 1, a metal base plate (plate thickness several millimeters) broader in area than the board 10 may be used as a foundation, mounted to the lower face of the metal foil 10b through a solder.

A semiconductor device 1 in which such thin semiconductor elements 20, 21 are mounted has greatly improved reliability. Next, the reliability is explained in detail.

First, prior to explaining reliability of the semiconductor device 1, the results of FEM (Finite Element Method) analyses of the stresses acting between the semiconductor elements 20, 21 and the solder layers 11a, 11b are explained.

Here, in order to calculate the stresses, a model is assumed in which a semiconductor element (here, an IGBT element) is mounted onto metal foil equivalent to the metal foils 10c and 10d in FIG. 1, through a solder layer (tin-silver solder) 100 μm in thickness, and the stresses occurring between the semiconductor element and the solder layer are calculated.

FIG. 2 explains the relation between the thickness of the semiconductor element and stress.

Here the horizontal axis indicates the thickness (in μm) of the semiconductor element, and the vertical axis indicates the stress (relative values) occurring between the semiconductor element and the solder layer.

As shown in the figure, stress occurring between the semiconductor element and the solder layer positioned below the semiconductor element tends to decrease as the thickness of the semiconductor element is decreased.

For example, if the stress is 100 when the thickness of the semiconductor element is 350 μm, then when a semiconductor element of thickness 150 μm is mounted, the stress is 85, and when a 100 μm semiconductor element is mounted, the stress is 75. Further, when a semiconductor element of thickness 80 μm is mounted, the stress is reduced to 70, and when a semiconductor element of thickness 50 μm is mounted, the stress is reduced to 55, which is the lowest value in the figure. In this way, it was found that the thinner the semiconductor element, the more stress occurring between the semiconductor element and the solder layer positioned below the semiconductor element is reduced.

Next, the reliability of a semiconductor device in which thin semiconductor elements are mounted is described.

As an example, the changes in power cycle tolerance were studied when a semiconductor element of thickness 350 μm and when a semiconductor element of thickness 85 μm were mounted in a semiconductor device. The results are explained below.

Figure 3B:
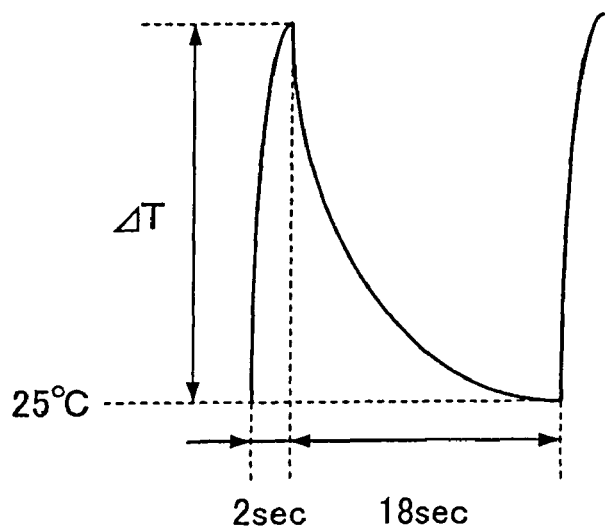

FIGS. 3(A) and 3(B) explain the relation between the semiconductor element thickness and the power cycle tolerance.

Here, the results for power cycle tolerance are shown in FIG. 3(A), whereas FIG. 3(B) shows in summary the method used for power cycle tests.

In FIG. 3(A), the horizontal axis indicates the temperature range ΔT (K) of cycle tests, and the vertical axis indicates the power cycle tolerance (relative values).

Further, in power cycle tests, cycle tests were repeated in which the semiconductor element and the solder layer positioned therebelow were heated over a two-second interval from an initial temperature room temperature, 25° C.) to +ΔT, as shown in FIG. 3(B), and the semiconductor element and solder layer were again cooled to the initial temperature of an interval of 18 seconds.

The results for power cycle tolerance shown in FIG. 3(A) are relative values for the power cycle tolerance, taking the power cycle tolerance at ΔT=125K for a semiconductor element of thickness 350 μm to be 1.

As shown in the figure, when a semiconductor element of thickness 85 μm is used, the power cycle tolerance at ΔT=100 to 125K is increased by four to ten times compared with when a semiconductor element of thickness 350 μm is mounted.

For example, when ΔT=100K, the power cycle tolerance when a semiconductor element of thickness 350 μm is used is 5, whereas the power cycle tolerance when a semiconductor element of thickness 85 μm is used is 20.

That is, when a semiconductor element of thickness 85 μm is used, the power cycle tolerance is four times greater than when a semiconductor element of thickness 350 μm is used.

Further, when ΔT=125K, the power cycle tolerance when using a semiconductor element of thickness 350 μm is 1, whereas the power cycle tolerance when using a semiconductor element of thickness 85 μm is 10.

That is, when a semiconductor element of thickness 85 μm is used, the power cycle tolerance is ten times greater than when suing a semiconductor element of thickness 350 μm.

Hence, when a semiconductor element of thickness less than 100 μm is mounted in a semiconductor device, the reliability as a semiconductor device is further improved.

In this way, the semiconductor device 1 has an insulating sheet 10a, metal foil 10b mounted to the lower face of the insulating sheet 10a, and metal foils 10c, 10d mounted to the upper face of the insulating sheet 10a, and in addition comprises semiconductor elements 20 and 21, of thickness 50 μm or greater and less than 100 μm, mounted onto the metal foils 10c, 10d through solder layers 11a, 11b.

By means of such a semiconductor device 1, even when the semiconductor device 1 is made to operate repeatedly, because the mounted semiconductor elements 20, 21 are thin, there is no substantial expansion or contraction of the semiconductor elements 20, 21 even when there is heat generation or dissipation by the semiconductor elements 20, 21. Hence there is no repeated occurrence of excessive stresses between the semiconductor elements 20, 21 and the solder layers 11a, 11b below the semiconductor elements 20, 21. As a result, even when the semiconductor device 1 is used over an extended period of time, peeling or breakage of wires at the interface between the semiconductor elements 20, 21 and the solder layers 11a, 11b does not tend to occur, and high reliability of the semiconductor device 1 is obtained.

Bonding of the semiconductor elements 20, 21 comprising the semiconductor device 1 to the metal foils 10c, 10d through solder layers 11a, 11b is performed by heat treatment.

Specifically, solder material in paste form is applied onto the metal foils 10c, 10d in advance, and after placing the semiconductor elements 20, 21 onto the solder material, heat treatment is performed to solder-bond the semiconductor elements 20, 21 to the metal foils 10c, 10d (not shown).

In such a semiconductor device 1, when the solder material is melted within a heating furnace, the semiconductor elements 20, 21 are self-aligned with the metal foils 10c, 10d.

However, because the semiconductor elements 20, 21 are thin, the semiconductor elements 20, 21 are light in weight, and so there are cases in which the semiconductor elements 20, 21 may be moved and shifted from the desired mounting positions when the solder material is melted.

This is because the lighter the semiconductor elements 20, 21, the more the position of the semiconductor elements 20, 21 depends on the fluid properties of the solder material in the molten state. In particular, if the solder material in paste form is applied to completely cover the metal foils 10c, 10d to perform soldering, shifting from the desired mounting positions (hereafter "position shifts") occurs more prominently.

In order to further explain this phenomenon, an example is explained for a metal foil 10c and semiconductor member 20.

Figure 4A:
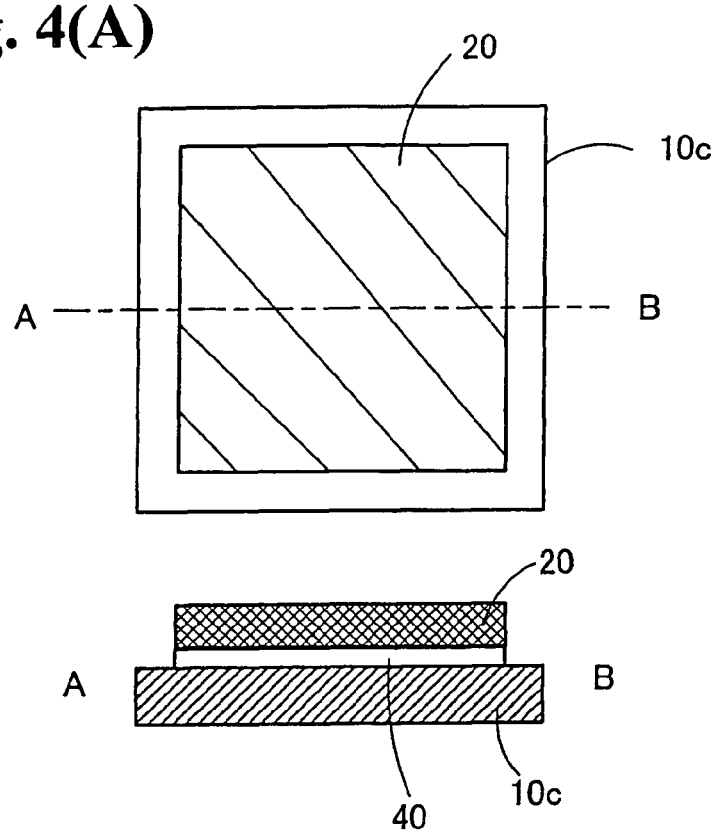
FIGS. 4(A) and 4(B) explain position misalignment.
Figure 4B:
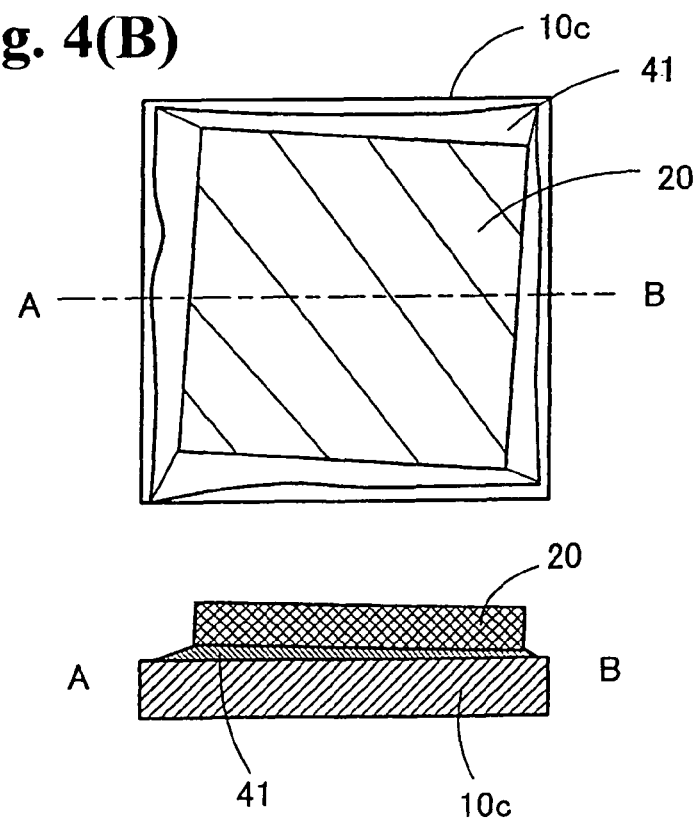

FIGS. 4(A) and 4(B) explain positioning shifting.

FIG. 4(A) shows a state in which the solder material 40 in paste form is applied to the metal foil 10c, and the semiconductor element 20 is placed on the solder material 40. As explained above, in the method of the prior art, solder material 40 in paste form is applied in so-called complete coverage, in substantially a rectangular shape, in the gap between the semiconductor element 20 and the metal foil 10c.

Next, in this state, the solder material 40 is heated in a heating furnace and melted, and the flux component is melted together with the solder component. The portion of the metal foil 10c which is wetted by the flux component is reduced, and the solder component wets and spreads over the reduced portion.

When, for example, the solder material 40 is melted in the heating furnace from the state in FIG. 4(A), the solder material 40 does not remain in the gap between the semiconductor element 20 and the metal foil 10c, but wets and spreads outside the outer peripheral edge of the metal foil 10c.

FIG. 4(B) shows a state in which the melted solder material 40 is solidified, and the semiconductor element 20 is bonded with the metal foil 10c with the solder layer 41 intervening.

As shown in the figure, when the solder material 40 in a full-coverage state wets and spreads, the spreading is not uniform over the upper face of the metal foil 10c, and spreading occurs non-uniformly toward the outer peripheral edges of the metal foil 10c. As a result, after solidification of the solder material 40, rotation or movement of the semiconductor element 20 occurs.

As a supplementary explanation of the process of this phenomenon, it is conjectured that position shifts are, for example, induced by the process explained below.

For example, when a semiconductor element 20 is placed on solder material 40 in the full-coverage state, the main face of the semiconductor element 20 is not perfectly parallel with the metal foil 10c, but is inclined to an extent. When the solder material 40 is melted in this state, the probability of wetting and spreading of the solder material 40 in certain directions is increased. Possibly, a similar phenomenon may occur if the board 10 itself is deformed.

Hence, for the above reasons, wetting and spreading of the solder material 40 occurs non-uniformly in the outer peripheral directions, and when the solder material 40 hardens in this state, a solder layer 41 is formed which is non-uniform in outward extent and in thickness, as shown in FIG. 4(B). As a result, rotation or movement of the semiconductor element 20 occurs, and a shift in position of the semiconductor element 20 with respect to the metal foil 10c is induced.

Thus, when solder material 40 in paste form is applied to the entirety of the metal foil 10c in this way, position shifts tend to be induced.

However, when such position shifts occur, wire bonding cannot be performed at prescribed locations, or other wiring problems occur in the process of wiring the electrodes of the semiconductor elements 20, 21, and so the reliability of the semiconductor device is reduced.

Hence, the thinner the semiconductor elements mounted in the semiconductor device, the greater is the need to suppress shifts in position as much as possible.

Hence, in the following embodiments, the configuration of a semiconductor device 1 in which there is minimal position shifting even when thin and lightweight semiconductor elements 20, 21 are mounted within the semiconductor device 1, as well as a method for manufacturing such a semiconductor device 1, are explained.

In the following embodiments, members which are the same as in the semiconductor device 1 of FIG. 1 are assigned with the same symbols, and explanations are omitted. Further, in the following embodiments, members used as examples in explanations are the metal foil 10c, solder layer 11a, and semiconductor element 20. Hence, explanations of the entirety of the semiconductor device 1 are omitted in the respective embodiments.

Second Embodiment

In this embodiment, in bonding the semiconductor element 20 and metal foil 10c shown in FIG. 1, the solder layer 11a comprises a solder material with components different from tin-silver solder.

For example, the solder layer 11a is formed using a solder material having a wettability with respect to the metal foil 10c lower than that of tin-silver solder. More specifically, a tin-antimony (Sb) solder is used to form the solder layer 11a.

Using such a solder material, flowability of the solder material on the metal foil 10c can be suppressed even when the solder material is melted in a heating furnace. That is, the solder material has low wettability with respect to the metal foil 10c, so that even when the solder material is melted, the solder material retains its original shape, and the solder material does not wet and spread within the gap between the semiconductor element 20 and the metal foil 10c. As a result, self-alignment of the semiconductor element 20 with respect to the metal foil 10c is further improved, and reliability of the semiconductor device is improved.

Third Embodiment

As for that the third embodiment, in performing bonding between the semiconductor element 20 and metal foil 10c shown in FIG. 1, a wetting suppression layer, which suppresses wetting by the solder material in the molten state, is arranged selectively in advance to the outer peripheral portion of the metal foil 10c. Also, the solder material is applied to the metal foil 10c with the metal face exposed, and the semiconductor element 20 and metal foil 10c are mounted.

Figure 5:
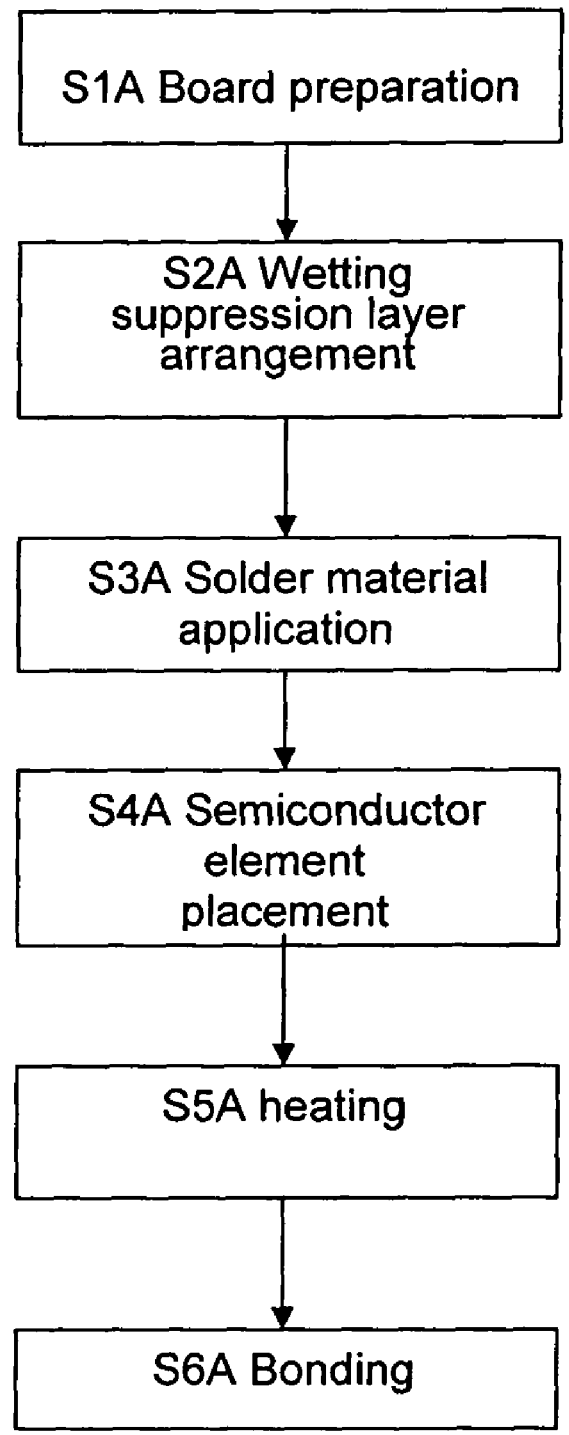
FIG. 5 shows the flow of manufacture of a semiconductor device in a third embodiment.

For example, FIG. 5 shows the flow of manufacture of the semiconductor device in the third embodiment.

As shown in the figure, first, a board 10 is prepared, comprising an insulating sheet 10a, a metal foil 10b mounted to the lower face of the insulating sheet 10a, and metal foils 10c, 10d mounted to the upper face of the insulating sheet 10a (step S1A).

Next, a wetting suppression layer, which suppresses wetting by solder in the molten state, is selectively arranged, for example, in the outer peripheral portion of the upper face of the metal foil 10c (step S2A).

Next, solder material is applied to the portion of the metal foil 10c in which the metal face is exposed (step S3A).

Next, a semiconductor element 20, of thickness 50 μm or greater and less than 100 μm, is placed on the solder material (step S4A).

Then, heating of the solder material is performed (step S5A), and the semiconductor element 20 is mounted to the metal foil 10c through a solder layer 11a (step S6A).

By means of this flow of manufacturing processes, the semiconductor element 20 is mounted to the metal foil 10c.

As specific examples of this embodiment, two embodiments are explained below. Explanations of these embodiments focus mainly on steps S2A through S6A.

Third Embodiment (1)

In this embodiment, upon bonding of the semiconductor element 20 and metal foil 10c shown in FIG. 1, a resist pattern is formed in advance on the upper face of the metal foil 10c as a wetting suppression layer, solder material is applied to the metal foil 10c with the metal face exposed, and the semiconductor element 20 and metal foil 10c are mounted. This bonding method is explained in detail using the drawings.

Figure 6A:
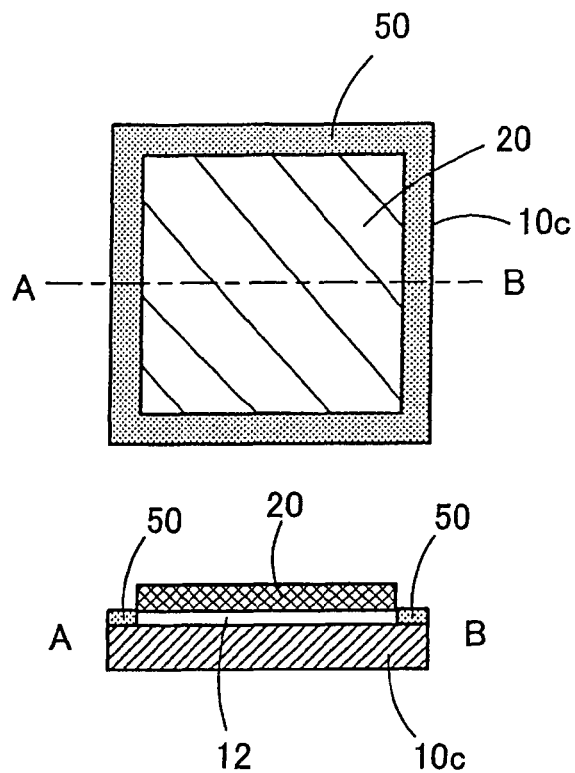
FIGS. 6(A) and 6(B) are diagrams explaining solder bonding of a semiconductor element and metal foil.
Figure 6B:
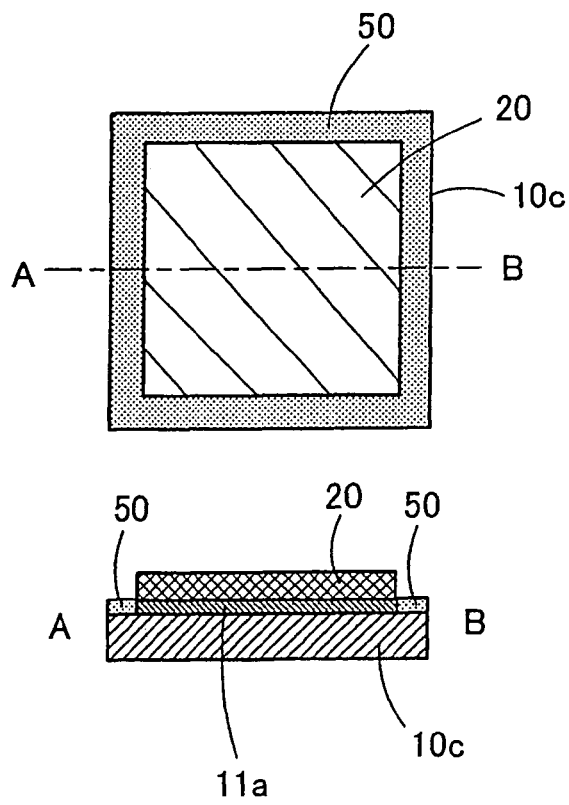

FIGS. 6(A) and 6(B) are used to explain solder bonding of a semiconductor element and metal foil.

First, as shown in FIG. 6(A), a resist pattern 50 is selectively arranged in the outer peripheral portion of the upper face of the metal foil 10c so as to surround the inner area of the upper face of the metal foil 10c. As explained above, this resist pattern 50 functions as a wetting suppression layer.

Here, the selective arrangement of the resist pattern 50 is for example performed using photolithography. Then, solder 12 in paste form (for example, tin-silver solder, or tin-antimony solder) is applied by a printing method onto the metal foil 10c with the metal face exposed. The semiconductor element 20 is then placed on the solder material 12.

Next, the solder material 12 is heated using a heating furnace and is melted (not shown). Then, the solder material 12 is cooled, and as shown in FIG. 6(B), the semiconductor element 20 and metal foil 10c are mounted through a solder layer 11a.

By means of this method, even when the solder material 12 is melted in the heating furnace, fluidity of the solder material 12 is suppressed by the existence of the resist pattern 50. That is, a resist pattern 50 in a dam shape is formed on the outer periphery of the upper face of the metal foil 10c, so that even when the solder material 12 is melted, the solder material 12 retains its original shape, and there is no non-uniform wetting and spreading of the solder material 12 on the metal foil 10c. Hence, movement or rotation of the semiconductor element 20 on the metal foil 10c during solder bonding does not readily occur. As a result, the self-alignment of the semiconductor element 20 with respect to the metal foil 10c is further improved, and reliability of the semiconductor device is improved.

The resist pattern 50 selectively arranged on the metal foil 10c is removed using an organic solvent after bonding of the semiconductor element 20 and metal foil 10c through the solder layer 11a.

Third Embodiment (2)

In this embodiment, upon bonding the semiconductor element 20 and metal foil 10c shown in FIG. 1, an oxide film is formed and patterned in advance on the upper face of the metal foil 10c as a wetting suppression layer, solder material is applied to the upper face of the metal foil 10c with the metal face exposed, and the semiconductor element 20 and metal foil 10c are bonded. This bonding method is explained in detail using the drawings.

Figure 7A:
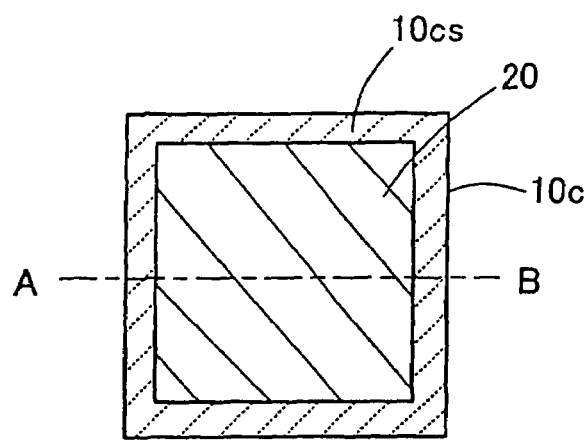
FIGS. 7(A) and 7(B) are diagrams explaining solder bonding of a semiconductor element and metal foil.
Figure 7A:
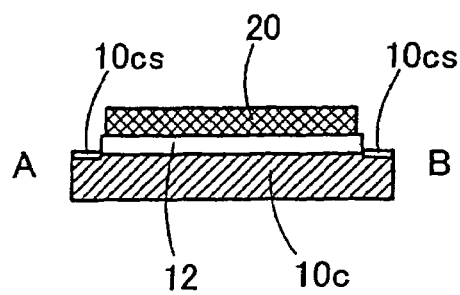
Figure 7B:
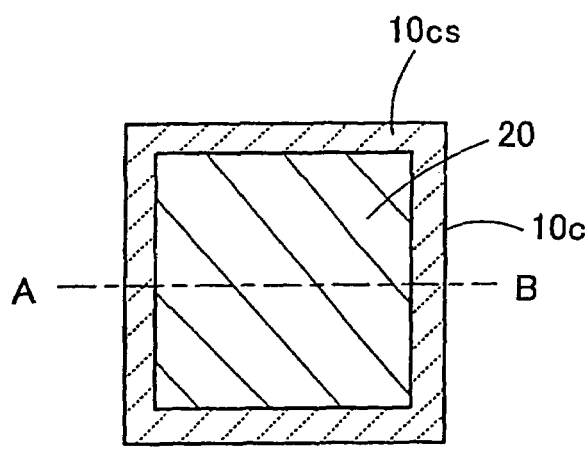
Figure 7B:
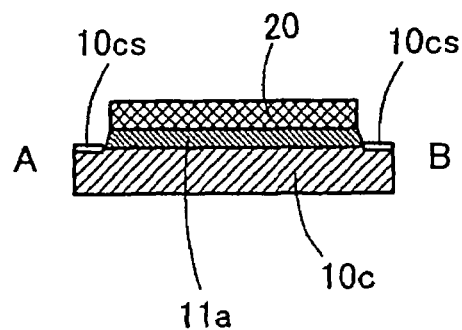

FIGS. 7(A) and 7(B) explain soldering bonding of a semiconductor element and metal foil.

First, as shown in FIG. 7(A), an oxide film 10cs (CuO) is selectively formed in the outer periphery on the upper face of the metal foil 10c so as to surround the inner area of the upper face of the metal foil 10c. As explained above, this oxide film 10cs functions as a wetting suppression layer.

The oxide film 10cs is formed as follows.

For example, photolithography is used to form a resist pattern in the inner area of the metal foil 10c (the region of application of solder material 12), such that the outer periphery of the upper face of the metal foil 10c is exposed; then, using this resist pattern as a mask, thermal oxidation treatment or oxygen plasma treatment of the upper face of the metal foil 10c is performed (not shown). Then, the resist pattern is removed, so that the oxide film 10cs is formed selectively only in the outer periphery of the upper face of the metal foil 10c.

Possibly, a laser resist method is used to directly form an oxide film 10cs in the outer periphery of the upper face of the metal foil 10c.

Then, solder material 12 (for example, tin-silver solder or tin-antimony solder) in paste form is applied by a printing method to the upper face of the metal foil 10c with metal face exposed, and the semiconductor element 20 is placed on the solder material 12.

Next, the solder material 12 is heated using a heating furnace and melted (not shown). Here, the wettability of the oxide film 10cs by the solder material 12 is known to be lower than the wettability of a metal surface by the solder material 12. The solder material 12 is then cooled, and as shown in FIG. 7(B), the semiconductor element 20 and metal foil 10c are bonded together with the solder layer 11a intervening.

By means of this method, even when the solder material 12 is melted in the heating furnace, fluidity of the solder material 12 is suppressed by the existence of the oxide film 10cs. That is, the oxide film 10cs is formed on the outer periphery of the upper face of the metal foil 10c, so that even when the solder material 12 is melted at the time of solder bonding, the solder material 12 retains its original shape, and there is no uneven wetting and spreading of the solder material 12. Hence, movement or rotation of the semiconductor element 20 on the metal foil 10c at the time of solder bonding does not readily occur. As a result, self-alignment of the semiconductor element 20 with respect to the metal foil 10c is further improved, and reliability of the semiconductor device is improved.

Fourth Embodiment

In this embodiment, upon bonding of the semiconductor element 20 and metal foil 10c shown in FIG. 1, solder material is patterned and formed in advance in the region for mounting the semiconductor element 20, demarcated on the metal foil 10c so as to be symmetrical with respect to the center portion of the mounting region, and the semiconductor element 20 and metal foil 10c are bonded.

Figure 8:
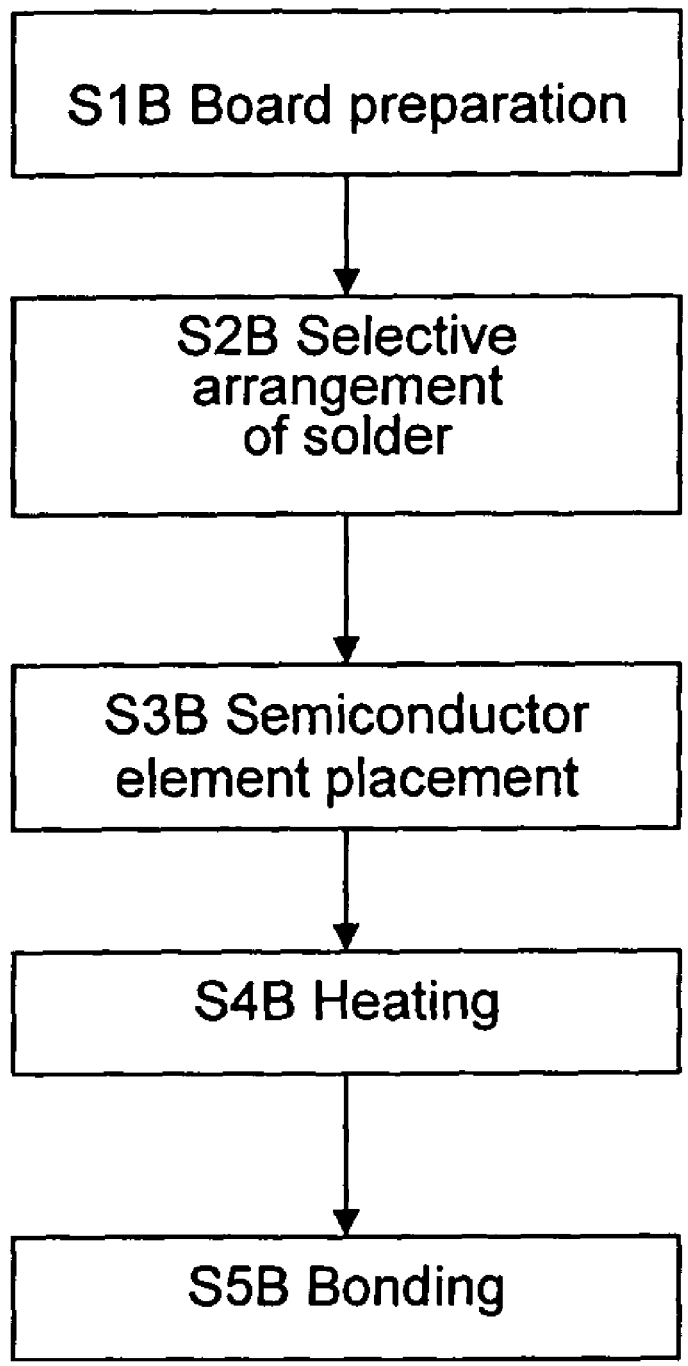
FIG. 8 shows the flow of manufacture of a semiconductor device in a fourth embodiment.

For example, FIG. 8 shows the flow of manufacturing of the semiconductor device in the fourth embodiment.

As shown in the figure, first, a board 10 is prepared, comprising an insulating sheet 10a, metal foil 10b mounted to the lower face of the insulating sheet 10a, and metal foils 10c, 10d mounted to the upper face of the insulating sheet 10a (step S1B).

Next, for example, solder material is selectively arranged in the element mounting region demarcated on the metal foil 10c so as to be symmetrical with respect to the center portion of the element mounting region (step S2B).

Next, the semiconductor element 20, of thickness 0.50 µm or greater and less than 100 µm, is placed on the selectively arranged solder material (step S3B).

Then, heating of the solder material is performed (step S4B), and the semiconductor element 20 and metal foil 10c are bonded through a solder layer 11a (step S5B).

By means of this flow of manufacturing processes, the semiconductor element 20 and metal foil 10c are bonded.

As specific examples of this embodiment, two embodiments are explained below. Explanations of these embodiments focus mainly on steps S2B through S5B.

Fourth Embodiment (1)

In this embodiment is, upon bonding of the semiconductor element 20 and metal foil 10c shown in FIG. 1, solder material arranged selectively on the upper face of the metal foil 10c is formed, and the semiconductor element 20 and metal foil 10c are bonded. This bonding method is explained in detail using the drawings.

Figure 9A:
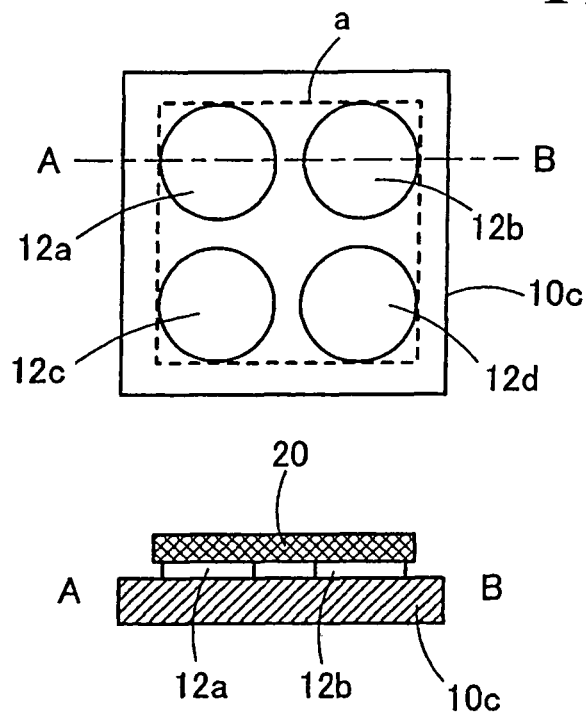
FIGS. 9(A) and 9(B) are diagrams explaining solder bonding of a semiconductor element and metal foil.
Figure 9B:
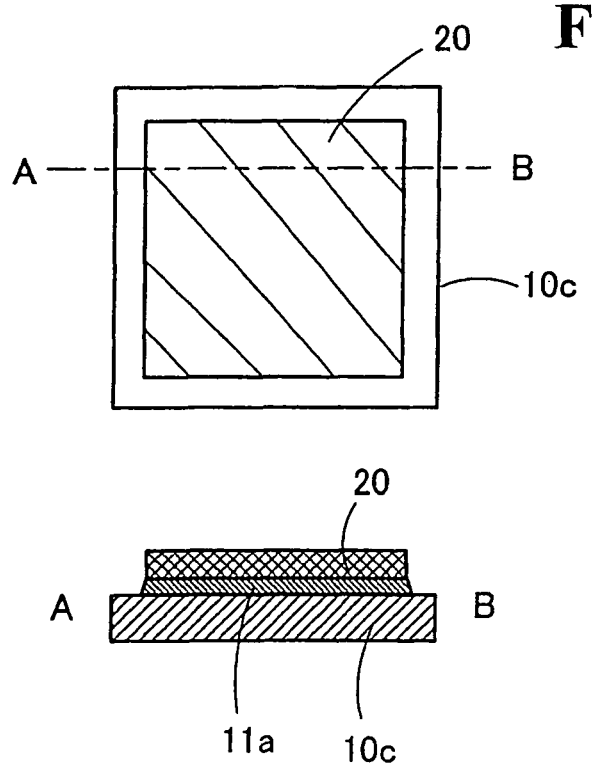
Figure 11:
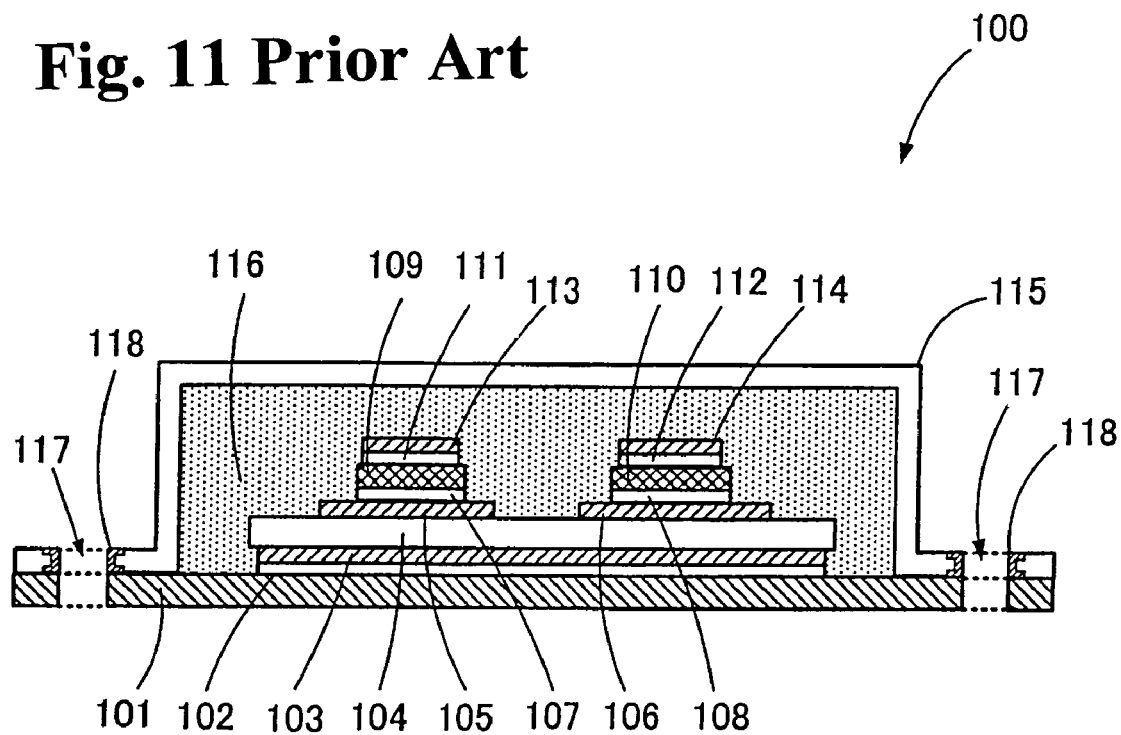
FIG. 11 is a schematic diagram of a semiconductor device employing a metal base plate as a foundation.
Figure 12:
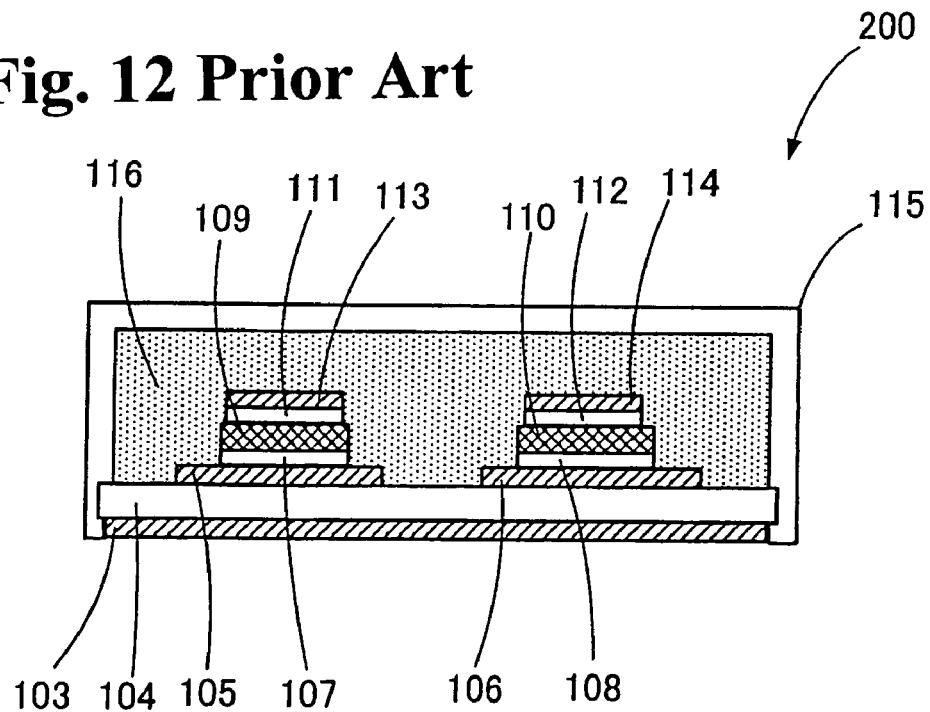
FIG. 12 is a schematic diagram of a semiconductor device not employing a metal base plate as a foundation.

FIGS. 9(A) and 9(B) explain a method of bonding a semiconductor element and metal foil.

First, as shown in FIG. 9(A), solder materials 12a, 12b, 12c, 12d (for example, tin-silver solder or tin-antimony solder) in paste form are selectively arranged on the metal foil 10c by a printing method. In the top view of FIG. 9(A), in order to explain the state after patterning of the solder materials 12a, 12b, 12c, 12d, only the outline of the semiconductor element 20 is indicated by a dashed line (the rectangular dashed line a in the figure), with a perspective view of the solder materials 12a, 12b, 12c, 12d. The interior of the rectangular dashed-line outline a is the mounting region for the semiconductor element 20, demarcated on the metal foil 10c.

Here, the solder materials 12a, 12b, 12c, 12d are divided and arranged in the four corners of the mounting region of the semiconductor element 20, with uniform shapes, areas and amounts so as to be symmetrical with respect to the center portion of the mounting region of the semiconductor element 20. In the figure, as one example, solder materials 12a, 12b, 12c, 12d with circular shapes are arranged on the metal foil 10c.

Then, after selectively arranging the solder materials 12a, 12b, 12c, 12d, the semiconductor element 20 is placed on the solder materials 12a, 12b, 12c, 12d.

In this state, due to the surface tension of the solder materials 12a, 12b, 12c, 12d, the semiconductor element 20 is held on the metal foil 10c.

Next, the solder materials 12a, 12b, 12c, 12d are heated in a heating furnace (not shown). Then, the solder materials 12a, 12b, 12c, 12d melt, with the position at which each is placed as a reference point. As explained above, the solder materials 12a, 12b, 12c, 12d are configured with uniform shapes, areas and amounts. Hence, when the solder materials 12a, 12b, 12c, 12d melt, due to the capillary effect, the solder materials 12a, 12b, 12c, 12d wet and spread at the same velocity in the gap between the semiconductor element 20 and the metal foil 10c.

FIG. 9(B) shows the state in which the melted solder materials 12a, 12b, 12c, 12d are cooled, and the semiconductor element 20 and metal foil 10c are bonded through a solder layer 11a.

As explained above, when the solder materials 12a, 12b, 12c, 12d are melted, these materials are wetting and spreading in the gap between the semiconductor element 20 and the metal foil 10c, and so the solder materials 12a, 12b, 12c, 12d, comprising the same components, ultimately merge. Then, after cooling, a solder layer 11a of uniform thickness is formed in the gap between the semiconductor element 20 and the metal foil 10c.

Because the melted solder materials 12a, 12b, 12c, 12d wet and spread at the same velocity from the respective reference points in the gap between the semiconductor element 20 and the metal foil 10c, movement or rotation of the semiconductor element 20 with respect to the metal foil 10c does not readily occur. As a result, self-alignment of the semiconductor element 20 with respect to the metal foil 10c is further improved, and reliability of the semiconductor device is improved.

Fourth Embodiment (2)

In this embodiment, upon bonding of the semiconductor element 20 and metal foil 10c shown in FIG. 1, solder material selectively arranged in advance on the upper face of the metal foil 10c is formed, and the semiconductor element 20 and metal foil 10c are bonded. This bonding method is explained in detail using the drawings.

FIGS. 10(A) and 10(B) explain solder bonding of a semiconductor element and metal foil.

First, as shown in FIG. 10(A), solder material 12e (for example, tin-silver solder or tin-antimony solder) in paste form is selectively arranged on the metal foil 10c using a printing method. In the top view of FIG. 10(A), in order to explain a state after patterning of the solder material 12e, only the outline of the semiconductor element 20 is shown by a dashed line (the rectangular dashed line a in the figure), with a perspective view of the solder material 12e. The interior of the rectangular dashed-line outline a is the mounting region for the semiconductor element 20, demarcated on the metal foil 10c.

Here, the solder material 12e is formed in a cross shape having four members, arranged so as to be symmetrical with respect to the center portion of the mounting region of the semiconductor element 20. The members have uniform widths and thicknesses.

After selectively arranging the solder material 12e, the semiconductor element 20 is placed on the solder material 12e.

In this state, due to surface tension of the solder material 12e, the semiconductor element 20 is held on the metal foil 10c.

Next, the solder material 12e is heated using a heating furnace (not shown). Then, the four areas of the solder material 12e melt, with the positions of arrangement of each as reference points. As explained above, the cross-shape solder material 12e is configured with uniform widths and thicknesses. Hence, when the solder material 12e melts, each of the areas of the solder material 12e wets and spreads at the same velocity in the gap between the semiconductor element 20 and the metal foil 10c, due to the capillary effect.

In FIG. 10(B), a state is shown in which the melted solder material 12e has been cooled, and the semiconductor element 20 and metal foil 10c are bonded with a solder layer 11a.

As explained above, when the solder material 12e is melted, wetting and spreading occurs in the gap between the semiconductor element 20 and metal foil 10c, and so after cooling, a solder layer 11a of uniform thickness is formed in the gap between the semiconductor element 20 and metal foil 10c.

Further, each of the areas of the melted solder material 12e wets and spreads at the same velocity from the respective reference points in the gap between the semiconductor element 20 and metal foil 10c, so that movement or rotation of the semiconductor element 20 on the metal foil 10c does not readily occur. As a result, self-alignment of the semiconductor element 20 with respect to the metal foil 10c is further improved, and reliability of the semiconductor device is improved.

In the second through fourth embodiments, examples were explained using the metal foil 10c, solder layer 11a, and semiconductor element 20 shown in FIG. 1; however, the members in the second through fourth embodiments are of course not limited only to the metal foil 10c, solder layer 11a, and semiconductor element 20. That is, the members of the second through fourth embodiments may of course include other metal foils mounted onto an insulating sheet 10a, solder layers on these metal foils, and other semiconductor elements mounted onto metal foils through these solder layers.

In the above embodiments, the semiconductor device 1 may be configured comprising heat spreaders on the semiconductor elements 20, 21.

The disclosure of Japanese Patent Application No. 2007-132573, filed on May 18, 2007, is incorporated in the application.

While the invention has been explained with reference to the specific embodiments of the invention, the explanation is illustrative and the invention is limited only by the appended claims.

What is claimed is:

1. A semiconductor device, comprising:
   a first metal foil;
   an insulating sheet mounted on an upper surface of the first metal foil;
   at least one second metal foil mounted on the insulating sheet;
   at least one solder layer mounted on the at least one second metal foil;
   at least one semiconductor element mounted on the at least one second metal foil through the at least one solder layer, said at least one semiconductor having a thickness of 50 µm or greater and less than 100 µm; and
   an oxide film selectively formed on an outer peripheral portion of an upper surface of the at least one second metal foil.

2. A semiconductor device, comprising:
   a first metal foil;
   an insulating sheet mounted on an upper surface of the first metal foil;
   at least one second metal foil mounted on the insulating sheet;
   at least one solder layer mounted on the at least one second metal foil;
   at least one semiconductor element mounted on the at least one second metal foil through the at least one solder layer, said at least one semiconductor having a thickness of 50 µm or greater and less than 100 µm; and
   a wetting suppressing layer formed on a selected portion of an upper face of the at least one second metal foil to suppress wetting by solder of the at least one solder layer,
   wherein the wetting suppressing layer comprises a resist pattern.

3. A semiconductor device according to claim 2, wherein a material of the at least one solder layer is tin-silver solder or tin-antimony solder.

4. A semiconductor device according to claim 2, wherein the resist pattern surrounds the at least one solder layer.

* * * * *

UNITED STATES PATENT AND TRADEMARK OFFICE
CERTIFICATE OF CORRECTION

| | | |
|---|---|---|
| PATENT NO. | : 8,026,566 B2 | Page 1 of 1 |
| APPLICATION NO. | : 12/149115 | |
| DATED | : September 27, 2011 | |
| INVENTOR(S) | : Masafumi Horio et al. | |

It is certified that error appears in the above-identified patent and that said Letters Patent is hereby corrected as shown below:

Title page, item [54] title, and column 1, line 1, change "SEMICONDUCTOR DEVICE AND METHOD FOR MANUFACTURING SEMICONDUCTOR DEVICE" to --SEMICONDUCTOR DEVICE--.

Change column 6, line 32, "25°C." to --25°C--.

Change column 11, line 29, "thickness 0.50μm" to --thickness 50μm--.

Signed and Sealed this
Eighth Day of May, 2012

David J. Kappos
*Director of the United States Patent and Trademark Office*